United States Patent
Kang et al.

(10) Patent No.: US 12,417,917 B2
(45) Date of Patent: Sep. 16, 2025

(54) METHODS FOR FABRICATING SEMICONDUCTOR DEVICES

(71) Applicant: Samsung Electronics Co., Ltd., Suwon-si (KR)

(72) Inventors: Sung Kun Kang, Seoul (KR); Hyun Woo Kim, Seongnam-si (KR); Cheol In Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 969 days.

(21) Appl. No.: 17/532,163

(22) Filed: Nov. 22, 2021

(65) Prior Publication Data

US 2022/0359200 A1 Nov. 10, 2022

(30) Foreign Application Priority Data

May 10, 2021 (KR) .................. 10-2021-0059862

(51) Int. Cl.
*H01L 21/033* (2006.01)
*H01L 21/027* (2006.01)
*H01L 21/308* (2006.01)

(52) U.S. Cl.
CPC ...... *H01L 21/0337* (2013.01); *H01L 21/0274* (2013.01); *H01L 21/0332* (2013.01); *H01L 21/3081* (2013.01); *H01L 21/3086* (2013.01)

(58) Field of Classification Search
CPC ............ H01L 21/0337; H01L 21/0274; H01L 21/0332; H01L 21/3081; H01L 21/3086; H01L 21/0335; H01L 21/0273

USPC .......................................................... 438/703
See application file for complete search history.

(56) References Cited

U.S. PATENT DOCUMENTS

| | | | |
|---|---|---|---|
| 6,923,920 | B2 | 8/2005 | Taylor et al. |
| 9,869,931 | B2 | 1/2018 | Hatakeyama |
| 10,008,619 | B2 | 6/2018 | Aliane et al. |
| 10,460,921 | B2 | 10/2019 | Lee et al. |
| 10,643,858 | B2 | 5/2020 | Lee et al. |
| 10,770,294 | B2 | 9/2020 | O'Meara et al. |
| 2019/0334028 | A1* | 10/2019 | Zi ............ G03F 7/094 |
| 2020/0133133 | A1 | 4/2020 | Park et al. |
| 2020/0348591 | A1 | 11/2020 | Kim et al. |
| 2020/0348594 | A1 | 11/2020 | Koh et al. |
| 2020/0356006 | A1 | 11/2020 | Yao et al. |
| 2022/0181153 | A1* | 6/2022 | Han ............ H01L 21/31116 |

* cited by examiner

*Primary Examiner* — Caleen O Sullivan
(74) *Attorney, Agent, or Firm* — Wolf, Greenfield & Sacks, P.C.

(57) ABSTRACT

A method for fabricating a semiconductor device includes forming a first mask layer on a substrate, forming an under layer on the first mask layer, forming a first photoresist pattern that includes tin on the under layer, converting at least a part of the first photoresist pattern into a second photoresist pattern including tin fluoride, through a plasma treatment process using fluorine element, etching the under layer using the second photoresist pattern as a first mask to form an under pattern, etching the first mask layer to form a first mask pattern, and etching at least a part of the substrate, using a mask pattern including the first mask pattern as a second mask.

20 Claims, 17 Drawing Sheets

METHODS FOR FABRICATING SEMICONDUCTOR DEVICES

CROSS-REFERENCE TO RELATED APPLICATION

This application claims priority from Korean Patent Application No. 10-2021-0059862 filed on May 10, 2021 in the Korean Intellectual Property Office, and all the benefits accruing therefrom under 35 U.S.C. 119, the contents of which in its entirety are herein incorporated by reference.

BACKGROUND

1. Technical Field

The present inventive concepts relate to methods for fabricating one or more semiconductor devices.

2. Description of the Related Art

Demands for high functionality, high speed, and smaller size of electronic components is increasing with development of the electronic industry, and the fabricating process of the semiconductor device is developing in a direction of improving the degree of integration. Therefore, patterns of highly scaled highly integrated semiconductor device may be spaced at fine pitches with fine line widths.

Patterning beyond the scope of utilization of DPT (Double Patterning) has been required, and a EUV (Extreme Ultraviolet) patterning technique has been introduced as a method for overcome this. However, since it is necessary to implement a fine pattern through the EUV patterning, the thickness of photoresist on which a pattern is formed by exposure needs to be thin.

At present, the thickness of the photoresist is not enough to sufficiently etch the under film quality, and the photoresist itself also lacks the etching selectivity. In order to compensate for the insufficient etching tolerance and thickness of the photoresist, for example, a process of further forming a film quality such as silicon oxide ($SiO_2$) on the photoresist pattern is performed.

SUMMARY

Aspects of the present inventive concepts provide a method for fabricating a semiconductor device in which an etching tolerance of a photoresist pattern is improved, by performing a plasma treatment process using a gas including fluorine (F) element on a photoresist pattern including tin (Sn) to convert the photoresist pattern into a photoresist pattern including tin fluoride ($SnF_x$).

Accordingly, in a method for fabricating a semiconductor device according to some example embodiments of the present inventive concepts, a fine pattern may be effectively formed by utilizing a photoresist pattern having improved etching tolerance. Further, in the method for fabricating a semiconductor device according to some example embodiments of the present inventive concepts, since a process of forming an additional layer on the photoresist pattern to supplement the etching tolerance of the photoresist pattern may be omitted by improving the etching tolerance of the photoresist pattern, the process may be simplified.

According to some example embodiments of the present inventive concepts, a method for fabricating a semiconductor device may include forming a first mask layer on a substrate, forming an under layer on the first mask layer, forming a first photoresist pattern on the under layer where the first photoresist pattern includes tin, converting at least a part of the first photoresist pattern into a second photoresist pattern including tin fluoride, through a plasma treatment process using fluorine element, etching the under layer using the second photoresist pattern as a first mask to form an under pattern, etching the first mask layer to form a first mask pattern, and etching at least a part of the substrate, using a mask pattern including the first mask pattern as a second mask.

According to some example embodiments of the present inventive concepts, there is provided a method for fabricating a semiconductor device, comprising forming a first mask layer on a substrate, forming a second mask layer on the first mask layer, forming an under layer on the second mask layer, forming a first photoresist pattern on the under layer where the first photoresist pattern includes tin, converting at least a part of the first photoresist pattern into a second photoresist pattern including tin fluoride, through a plasma treatment process using fluorine element, etching the under layer using the second photoresist pattern as a first mask to form an under pattern, etching the second mask layer using the under pattern as a second mask to form a second mask pattern, etching the first mask layer using the second mask pattern as a third mask to form a first mask pattern, and etching at least a part of the substrate, using a mask pattern including the first mask pattern and the second mask pattern.

According to some example embodiments of the present inventive concepts, there is provided a method for fabricating a semiconductor device, comprising forming a first mask layer on a substrate, forming an under layer on the first mask layer, forming a first photoresist pattern on the under layer where the first photoresist pattern includes tin, through a lithography process using extreme ultraviolet light, for example using light having a 2% full width at half maximum (FWHM) bandwidth about 13.5 nm, entirely converting the first photoresist pattern into a second photoresist pattern including tin fluoride, through a plasma treatment process using fluorine element, etching the under layer using the second photoresist pattern as a first mask to form a under pattern, etching the first mask layer to form a first mask pattern, and etching at least a part of the substrate, using a mask pattern including the first mask pattern as a second mask, wherein after the second photoresist pattern is formed, no additional layer being in contact with each of an upper surface and side walls of the second photoresist pattern is formed.

However, aspects of the present inventive concepts are not restricted to the one set forth herein. The above and other aspects of the present inventive concepts will become more apparent to one of ordinary skill in the art to which the present inventive concepts pertains by referencing the detailed description of the present inventive concepts given below.

BRIEF DESCRIPTION OF THE DRAWINGS

The above and other aspects and features of the present inventive concepts will become more apparent by describing in detail some example embodiments thereof referring to the attached drawings, in which.

DETAILED DESCRIPTION

Figure 1:
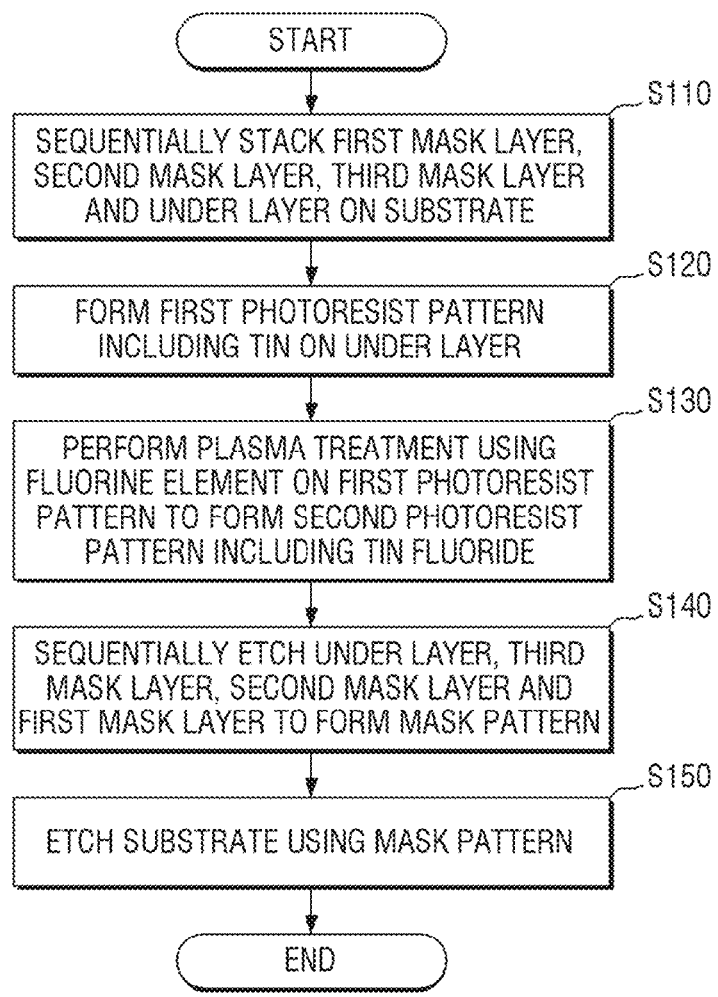
FIG. 1 is a flowchart for explaining a method for fabricating a semiconductor device according to some example embodiments of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a method for fabricating a semiconductor device according to some example embodiments of the present inventive concepts will be described referring to FIGS. 1 to 7.

FIG. 1 is a flowchart for explaining a method for fabricating a semiconductor device according to some example embodiments of the present inventive concepts. FIGS. 2, 3, 4, 5, 6, and 7 are intermediate stage diagrams for explaining the method for fabricating a semiconductor device according to some example embodiments of the present inventive concepts.

Figure 2:
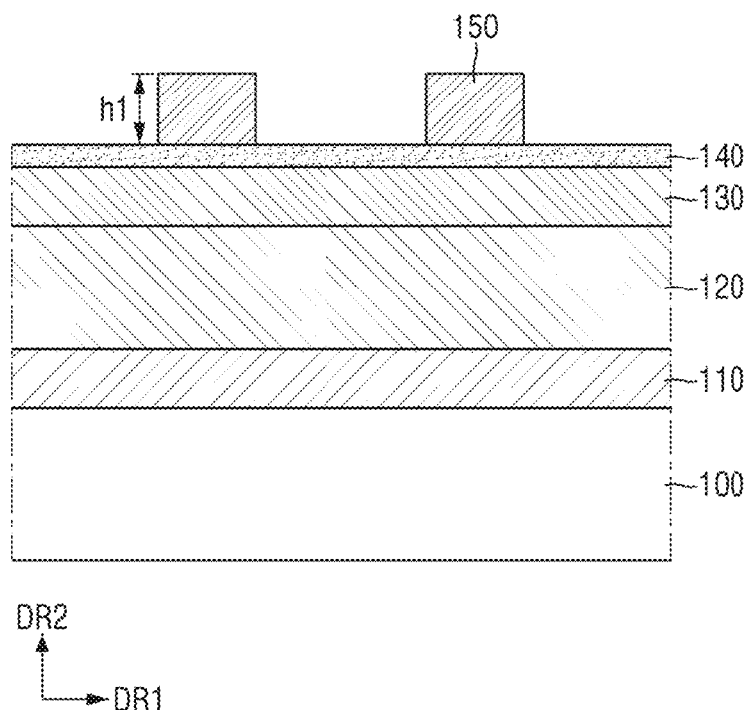
FIGS. 2, 3, 4, 5, 6, and 7 are intermediate stage diagrams for explaining a method for fabricating a semiconductor device according to some example embodiments of the present inventive concepts.

Referring to FIGS. 1 and 2, a first mask layer 110, a second mask layer 120, a third mask layer 130, an under layer 140, and a first photoresist pattern 150 may be stacked sequentially on a substrate 100 (S110).

The substrate 100 may be a structure in which a fine pattern is formed through a patterning process. For example, the substrate 100 may be bulk silicon or SOI (silicon-on-insulator). The substrate 100 may be a silicon substrate or may include other substances, for example, silicon germanium, gallium arsenide, SGOI (silicon germanium on insulator), indium antimonide, lead tellurium compounds, indium arsenide, indium phosphide, gallium arsenide or gallium antimonide. Further, the substrate 100 may have an epitaxial layer firmed on a base substrate, and may be a ceramic substrate, a quartz substrate, a glass substrate for a display, or the like. Further, the substrate 100 may contain an insulating substance or a conductive substance. That is, the substrate 100 is not limited as long as it is a structure that requires the formation of a fine pattern through the patterning process.

At S110, the first mask layer 110 may be formed on the substrate 100. The first mask layer 110 may be formed on the substrate 100 by (e.g., based on), for example, a coating process such as a spin coating process, a dip coating process, and a spray coating process.

The first mask layer 110 may include, for example, silicon oxynitride (SiON). However, the present inventive concepts are not limited thereto. In some example embodiments, the first mask layer 110 may include at least one of silicon oxide ($SiO_2$), silicon nitride (SiN), silicon carbide (SiC), silicon oxycarbide (SiOC), silicon carbonitride (SiCN), or silicon oxycarbonitride (SiOCN). Moreover, in some example embodiments, the first mask layer 110 may be a polymer film including at least one of a carbon (C) atom, a hydrogen (H) atom, or an oxygen (O) atom.

Still referring to S110, the second mask layer 120 may be formed on the first mask layer 110. The second mask layer 120 may be formed on the first mask layer 110 by (e.g., based on), for example, a spin coating process or chemical vapor deposition (CVD) process. Although the second mask layer 120 may include, for example, a spin-on hardmask (SOH) or amorphous carbon layer (ACL), the present inventive concepts are not limited thereto.

Still referring to S110, the third mask layer 130 may be formed on the second mask layer 120. The third mask layer 130 may be formed on the second mask layer 120 by (e.g., based on), for example, the spin coating process.

The third mask layer 130 may include, for example, silicon oxynitride (SiON). However, the present inventive concepts are not limited thereto. In some example embodiments, the third mask layer 130 may include at least one of silicon oxide ($SiO_2$), silicon nitride (SiN), silicon carbide (SiC), silicon oxycarbide (SiOC), silicon carbonitride (SiCN), or silicon oxycarbonitride (SiOCN). Moreover, in some example embodiments, the third mask layer 130 may be a polymer film including at least one of a carbon (C) atom, a hydrogen (H) atom, or an oxygen (O) atom.

Still referring to S110, the under layer 140 may be formed on the third mask layer 130. The under layer 140 may be formed on the third mask layer 130, for example, by (e.g., based on) the spin coating process or chemical vapor deposition (CVD) process. The under layer 140 may include, for example, a polymer film including at least one of a carbon (C) atom, a hydrogen (H) atom, an oxygen (O) atom or a silicon (Si) atom. However, the present inventive concepts are not limited thereto. In some example embodiments, the second and/or third mask layers 120 and/or 130 may be omitted, and the under layer 140 may be formed directly or indirectly on the first mask layer 110.

The first photoresist pattern 150 may be formed on the under layer 140 (S120). The first photoresist pattern 150 may be formed on the under layer 140 through a lithography process using extreme ultraviolet, also referred to as extreme ultraviolet light (EUV), for example using light having a 2% full width at half maximum (FWHM) bandwidth about 13.5 nm. The first photoresist pattern 150 may include, for example, tin (Sn).

For example, the first photoresist pattern 150 may include a plurality of structures spaced apart from each other in a horizontal direction DR1. A height h1 of the first photoresist pattern 150 in a vertical direction DR2 may have a range of, for example, 10 nm to 50 nm. However, the present inventive concepts are not limited thereto.

Figure 3:
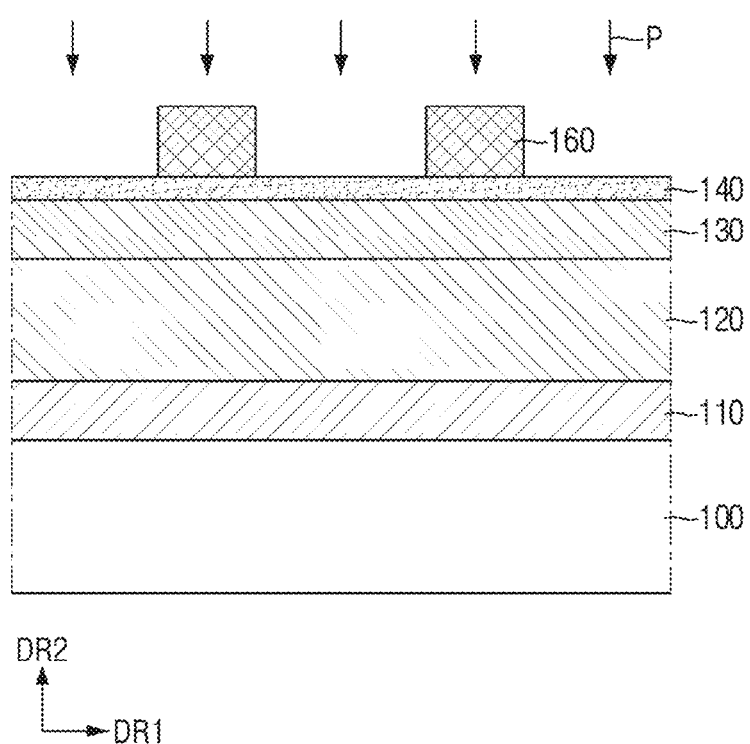

Referring to FIGS. 1 and 3, a plasma treatment process P may be performed on the first photoresist pattern 150. The plasma treatment process P may be performed, using a gas including fluorine (F) element. The gas used in the plasma treatment process P may include, for example, at least one of $SF_6$, $CF_4$, $CHF_3$, $CH_2F_2$, $CH_3F$ or $NF_3$.

The plasma treatment process P may be performed, for example, under process conditions of a chamber pressure in the range of 1 mm Torr to 50 mm Torr, RF powers in the range of 100 W to 2,000 W, bias voltage in the range of 0 V to 100 V applied to the chuck electrode, a flow rate of plasma treatment gas in the range of 10 sccm (standard cubic centimeters per minute) to 500 sccm, and a plasma treatment time in the range of 3 to 60 seconds.

At least a part of the first photoresist pattern 150 may be converted into a second photoresist pattern 160 including tin fluoride ($SnF_x$) through (e.g., based on) the plasma treatment process P using fluorine (F) element. That is, tin (Sn) included in the first photoresist pattern 150 is combined with the fluorine (F) element included in the gas used in the plasma treatment process P, and may be converted into a second photoresist pattern 160 including tin fluoride ($SnF_x$). Here, x may be, for example, 2 or 4. However, the present inventive concepts are not limited thereto.

For example, through the plasma treatment process P using fluorine (F) element, at least a part, or an entirety, of the first photoresist pattern 150 including tin (Sn) may generally be converted into the second photoresist patter 160 including tin fluoride ($SnF_x$) (S130). The concentration of tin fluoride ($SnF_x$) included in the second photoresist pattern 160 may be higher on the surface than on the inside.

The second photoresist pattern 160 including tin fluoride ($SnF_x$) may have a relatively higher etching tolerance than the first photoresist pattern 150 including tin (Sn). The tin fluoride ($SnF_x$) has a relatively high binding force and a relatively low volatility, and therefore, may have a relatively high etching tolerance.

After the second photoresist pattern 160 is formed, no additional layer is formed on the second photoresist pattern 160. Fax example, after the second photoresist pattern 160 is formed, no additional layer which is in contact with each of the upper surface and side walls of the second photoresist pattern 160 is formed.

The reason is that, because the second photoresist pattern 160 including tin fluoride ($SnF_x$) has a relatively high etching tolerance, it is possible to perform a sufficient function as a mask, even without forming another additional layer on the second photoresist pattern 160. Further, since the second photoresist pattern 160 including tin fluoride ($SnF_x$) has a relatively high etching tolerance, the height (h1 of FIG. 2) of the second photoresist pattern 160 in the vertical direction DR2 may be formed to be relatively small.

Referring to FIGS. 1 and 4 to 6, the under layer 140, the third mask layer 130, the second mask layer 120, and the first mask layer 110 may be sequentially etched to form a mask pattern 170 (S140).

Figure 4:
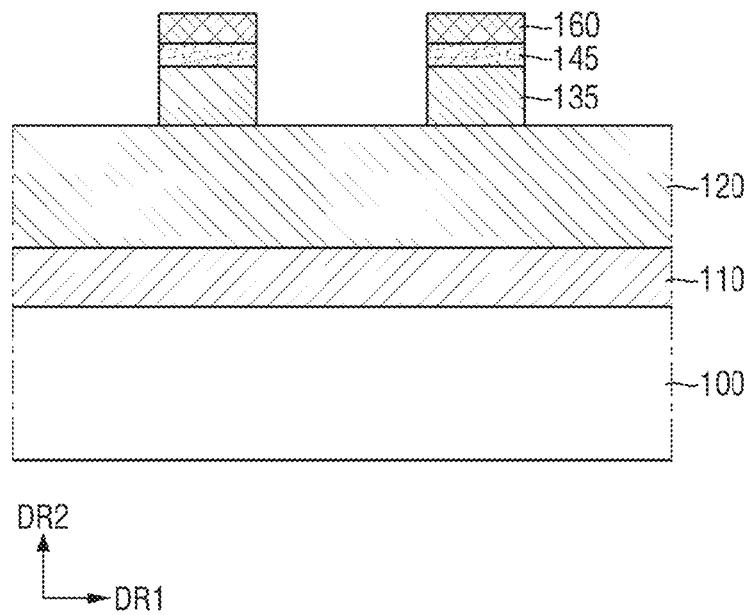

Specifically, referring to FIG. 4, the under layer (140 of FIG. 3) may be etched using the second photoresist pattern 160 as a mask to form an under pattern 145. A part of the second photoresist pattern 160 may be etched while the under pattern 145 is being formed. Although FIG. 4 shows that only the upper part of the second photoresist pattern 160 is etched while the under pattern 145 is being formed, this is only for convenience of explanation, and a part of the side walls of the second photoresist pattern 160 may also be etched.

Subsequently, the third mask layer (130 of FIG. 3) may be etched using the second photoresist pattern 160 and the under pattern 145 as masks to form a third mask pattern 135. A part of the second photoresist pattern 160 may be further etched, while the third mask pattern 135 is being formed. Although FIG. 4 shows that only the upper part of the second photoresist pattern 160 is etched while the third mask pattern 135 is being formed, this is only for convenience of explanation, and a part of the side walls of the second photoresist pattern 160 and a part of the side walls of the under pattern 145 may also be etched.

Figure 5:
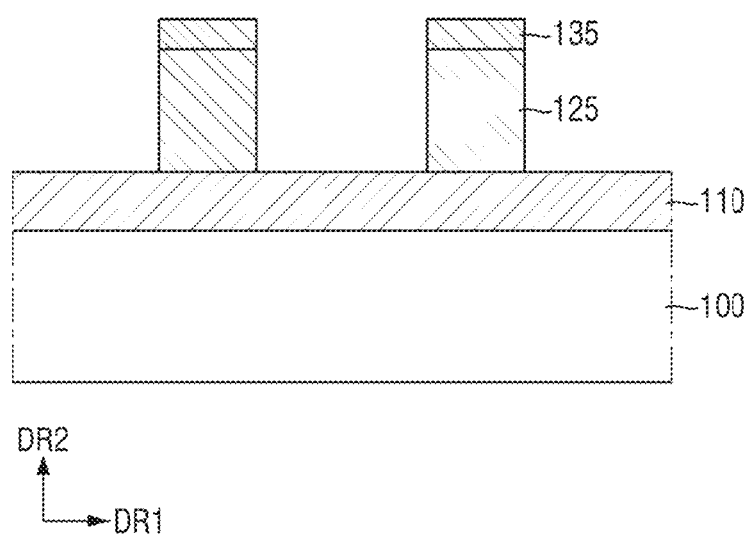

Referring to FIG. 5, the second mask layer 120 may be etched using at least a part of the second photoresist pattern 160, the under pattern 145 and the third mask pattern 135 as masks to form a second mask pattern 125.

For example, the second photoresist pattern 160 and the under pattern 145 may be etched, while the second mask pattern 125 is being formed. Also, a part of the third mask pattern 135 may be etched, while the second mask pattern 125 is being formed. Although FIG. 5 shows that only the upper part of the third mask pattern 135 is etched while the second mask pattern 125 is being formed, this is only for convenience of explanation, and a part of the side walls of the third mask pattern 135 may also be etched.

Figure 6:
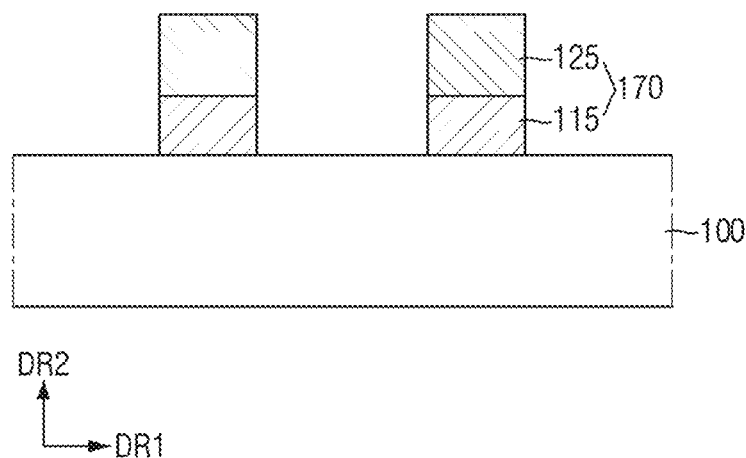

Referring to FIG. 6, the first mask layer 110 may be etched using at least a part of the third mask pattern 135 and the second mask pattern 125 as masks to form a first mask pattern 115.

For example, the third mask pattern 135 may be etched while the first mask pattern 115 is being formed. Also, a part of the second mask pattern 125 may be etched while the first mask pattern 115 being is formed. Although FIG. 6 shows that only the upper part of the second mask pattern 125 is etched while the first mask pattern 115 is being formed, this is only for convenience of explanation, and a part of the side walls of the second mask pattern 125 may also be etched.

Figure 7:
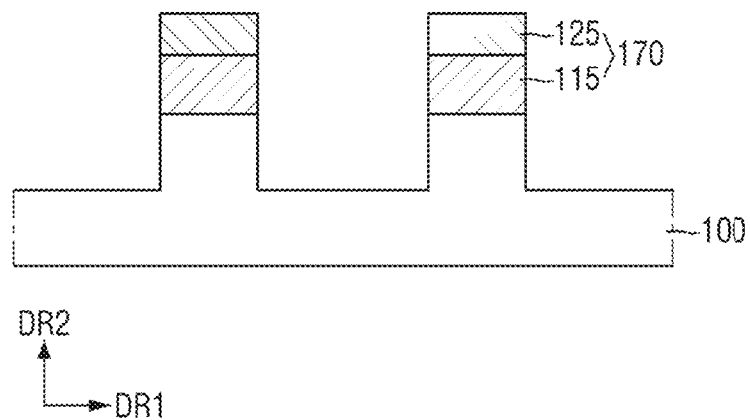

Referring to FIGS. 1 and 7, at least a part of the substrate 100 may be etched, using the mask pattern 170 including the second mask pattern 125 and the first mask pattern 115 as masks (S150). However, the present inventive concepts are not limited thereto. In some example embodiments, the mask pattern 170 may include the first mask pattern 115. A fine pattern may be formed on the substrate 100 through such a patterning process.

The method for fabricating a semiconductor device according to some example embodiments of the present inventive concepts may improve the etching tolerance of the second photoresist pattern 160, by (e.g., based on) performing the plasma treatment process P using a gas including fluorine (F) element on the first photoresist pattern 150 including tin (Sn) to convert the first photoresist pattern 150 into the second photoresist pattern 160 including tin fluoride ($SnF_x$).

Therefore, the method for fabricating a semiconductor device according to some example embodiments of the present inventive concepts may effectively form a fine pattern by (e.g., based on) utilizing the second photoresist pattern 160 having improved etching tolerance. Further, in the method for fabricating the semiconductor device according to some example embodiments of the present inventive concepts, since it is possible to omit the process of forming an additional layer on the second photoresist pattern 160 to supplement the etching tolerance of the second photoresist pattern 160, by (e.g., based on) improving the etching tolerance of the second photoresist pattern 160, the process may be simplified.

Hereinafter, a method for fabricating a semiconductor device according to some example embodiments of the present inventive concepts will be described referring to FIGS. 2, 8 and 9. Differences from the method for fabricating a semiconductor device shown in FIGS. 1 to 7 will be mainly described.

Figure 8:
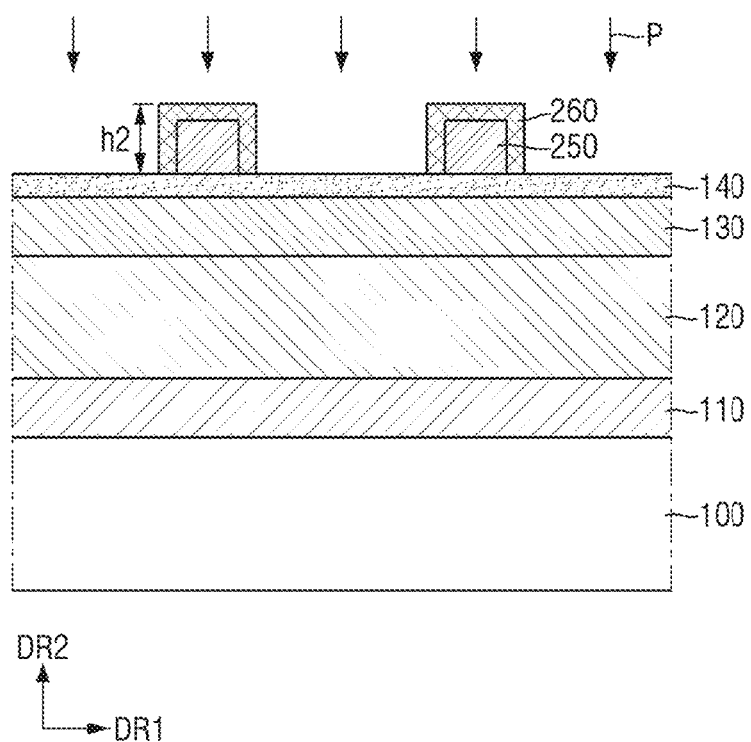
FIGS. 8 and 9 are intermediate stage diagrams for explaining a method for fabricating a semiconductor device according to some example embodiments of the present inventive concepts.
Figure 9:
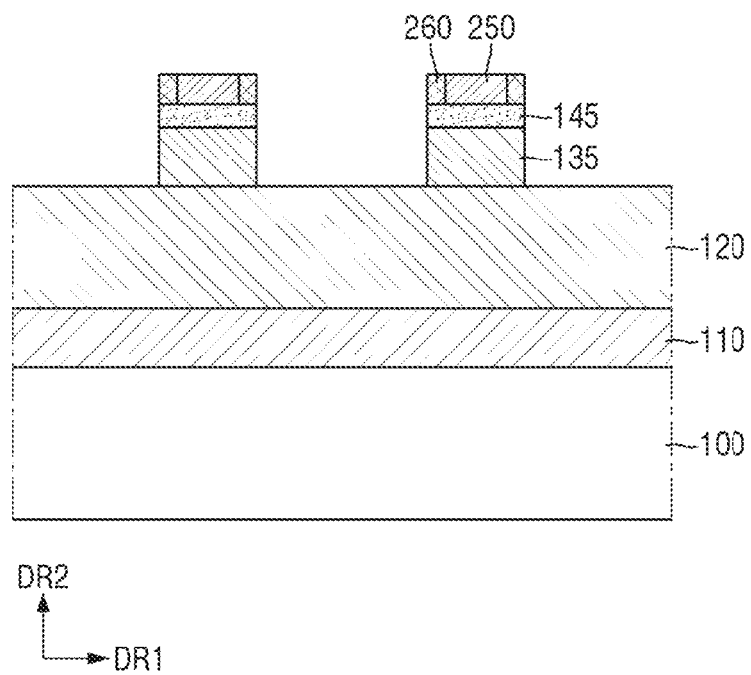

FIGS. 8 and 9 are intermediate stage diagrams for explaining a method for fabricating a semiconductor device according to some example embodiments of the present inventive concepts.

Referring to FIG. 2, the first mask layer 110, the second mask layer 120, the third mask layer 130, the under layer 140, and the first photoresist pattern 150 may be sequentially stacked on the substrate 100.

Referring to FIG. 8, the plasma treatment process P using a gas including fluorine (F) element may be performed on the first photoresist pattern (150 of FIG. 2).

The surface of the first photoresist pattern (150 of FIG. 2) may be converted into a second photoresist pattern 260 including tin fluoride ($SnF_x$) through the plasma treatment process P using fluorine (F) element.

For example, the upper surface and side walls of the first photoresist pattern (150 of FIG. 2) including tin (Sn) may be converted into the second photoresist pattern 260 including tin fluoride ($SnF_x$) through the plasma treatment process P using fluorine (F) element. A remaining portion 250 of the first photoresist pattern that has not been converted into the second photoresist pattern 260 may be surrounded by the second photoresist pattern 260.

After the second photoresist pattern 260 is formed, no additional layer is formed on the second photoresist pattern 260. For example, after the second photoresist pattern 260 is formed, no additional layer which is in contact with each of the upper surface and side walls of the second photoresist pattern 260 is formed.

The height h2 f the second photoresist pattern 260 in the vertical direction DR2 may be the same as the height h1 of the first photoresist pattern (150 of FIG. 2) in the vertical direction DR2. That is, the height h2 in the vertical direction DR2 from the upper surface of the under layer 140 to the upper surface of the second photoresist pattern 260 may be the same as the height h1 of the first photoresist pattern (150 of FIG. 2) in the vertical direction DR2.

Referring to FIG. 9, the under layer (140 of FIG. 8) may be etched using the remaining portion 250 of the first photoresist pattern and the second photoresist pattern 260 as masks to form the under pattern 145. A part of the second photoresist pattern 260 and a part of the remaining portion 250 of the first photoresist pattern may be etched, while the under pattern 145 is being formed.

Subsequently, the third mask layer (130 of FIG. 8) may be etched using the remaining portion 250 of the first photoresist pattern, the second photoresist pattern 260 and the under pattern 145 as masks to form a third mask pattern 135. While the third mask pattern 135 is being formed, a part of the remaining portion 250 of the first photoresist pattern and a part of the second photoresist pattern 260 may be additionally etched. Subsequently, the fabricating processes shown in FIGS. 5 to 7 may be performed to form a fine pattern on the substrate 100.

Hereinafter, a method for fabricating a semiconductor device according to some example embodiments of the present inventive concepts will be described referring to FIGS. 10 to 15. Differences from the method for fabricating the semiconductor device shown in FIGS. 1 to 7 will be mainly described.

Figure 10:
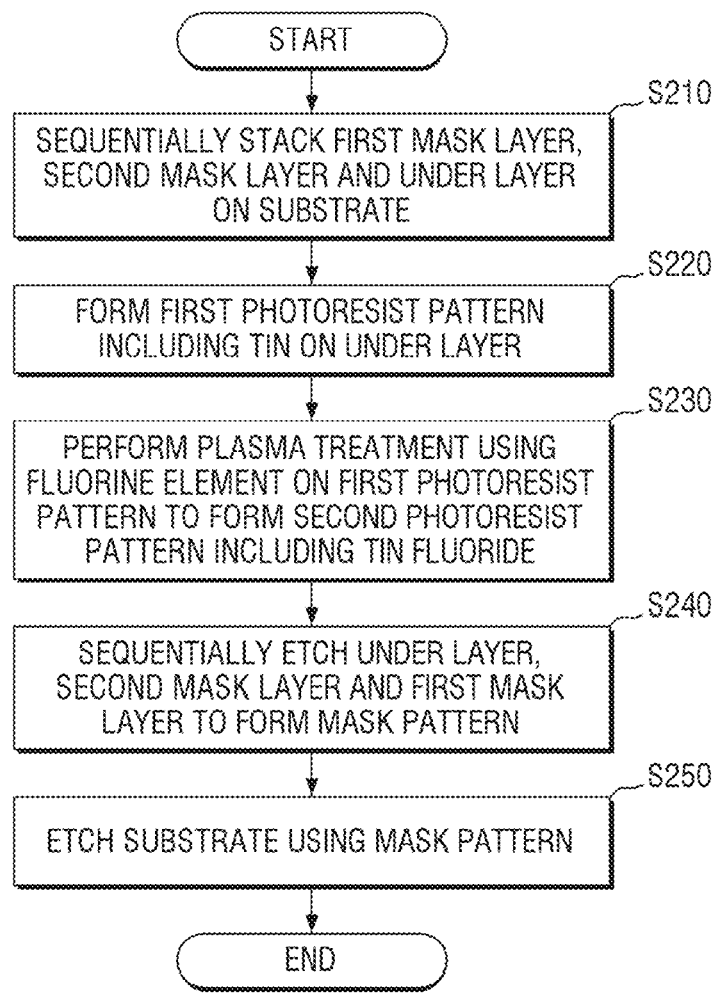
FIG. 10 is a flowchart for explaining a method for fabricating a semiconductor device according to some example embodiments of the present inventive concepts.

FIG. 10 is a flowchart for explaining a method for fabricating a semiconductor device according to some example embodiments of the present inventive concepts. FIGS. 11 to 15 are intermediate stage diagrams for explaining the method for fabricating a semiconductor device according to some example embodiments of the present inventive concepts.

Figure 11:
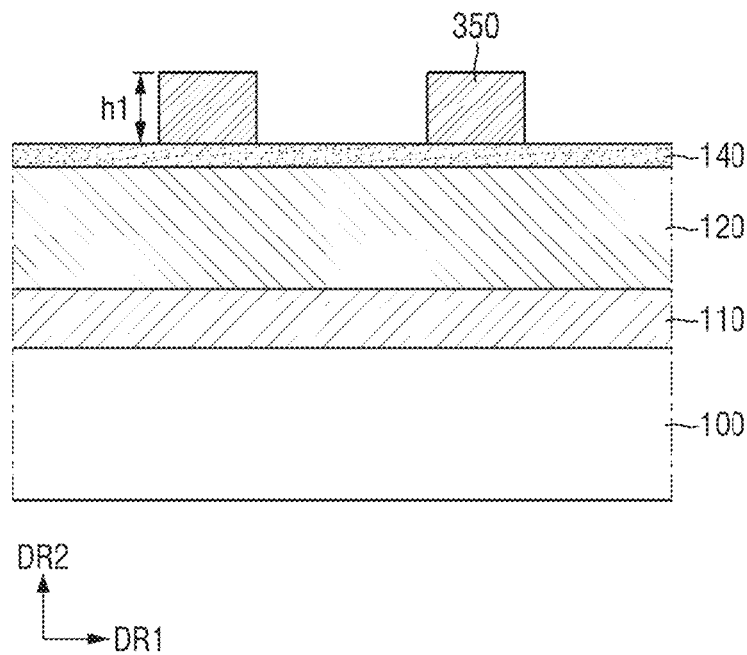
FIGS. 11, 12, 13, 14, and 15 are intermediate stage diagrams for explaining a method for fabricating a semiconductor device according to some example embodiments of the present inventive concepts.

Referring to FIGS. 10 and 11, the first mask layer 110, the second mask layer 120 and the under layer 140 may be sequentially stacked on the substrate 100 (S210), for example such that the first mask layer 110 is formed on the substrate 100, the second mask layer 120 is formed on the first mask layer 110, and the under layer 140 is formed on the second mask layer 120. As shown in at least FIG. 3, forming the under layer 140 on the second mask layer 120 may include forming a third mask layer 130 on the second mask layer 120, and forming the under layer 140 on the third mask layer 130.

Subsequently, a first photoresist pattern 350 may be formed on the under layer 140 (S220). The first photoresist pattern 350 may be formed on the under layer 140 through a lithography process using extreme ultraviolet, also referred to as extreme ultraviolet light (EUV), for example using light having a 2% full width at half maximum (FWHM) bandwidth about 13.5 nm. The first photoresist pattern 350 may include, for example, tin (Sn).

Figure 12:
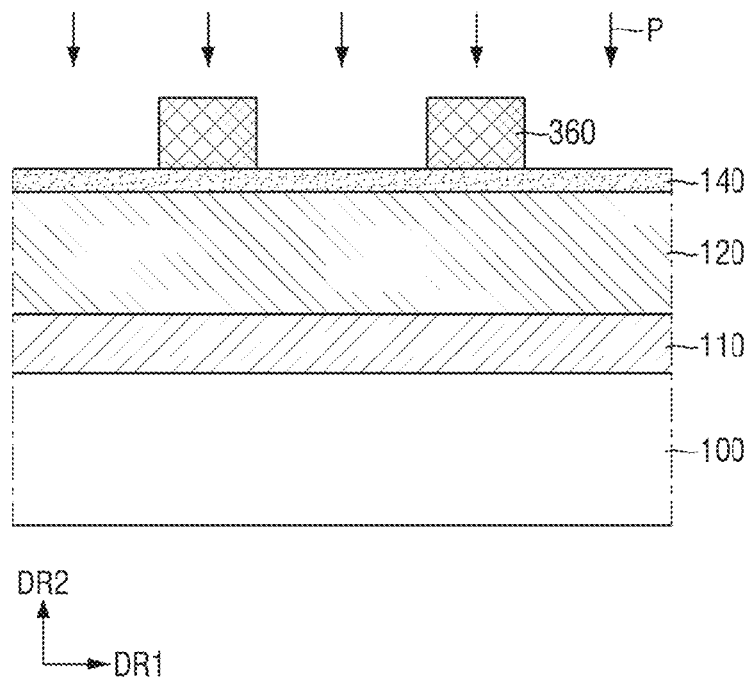

Referring to FIGS. 10 and 12, the plasma treatment process P using a gas including fluorine (F) element may be performed on the first photoresist pattern (350 of FIG. 11).

The first photoresist pattern (350 of FIG. 11) including tin (Sn) may be at least partially or entirely converted into a second photoresist pattern 360 including tin fluoride ($SnF_x$), through the plasma treatment process P using fluorine (F) element (S230). The concentration of tin fluoride ($SnF_x$) included in the second photoresist pattern 360 may be higher on the surface than on the inside.

After the second photoresist pattern 360 is formed, no additional layer is formed on the second photoresist pattern 360. For example, after the second photoresist pattern 360 is formed, no additional layer which is in contact with each of the upper surface and side walls of the second photoresist pattern 360 is formed.

Figure 13:
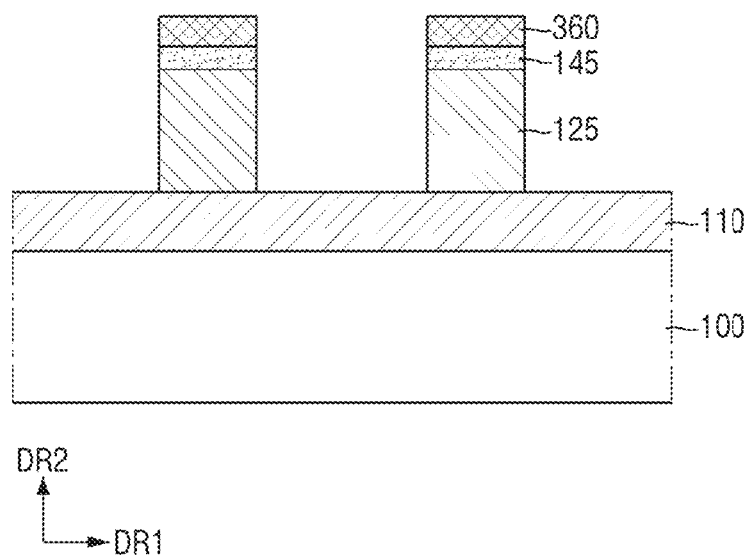
Figure 14:
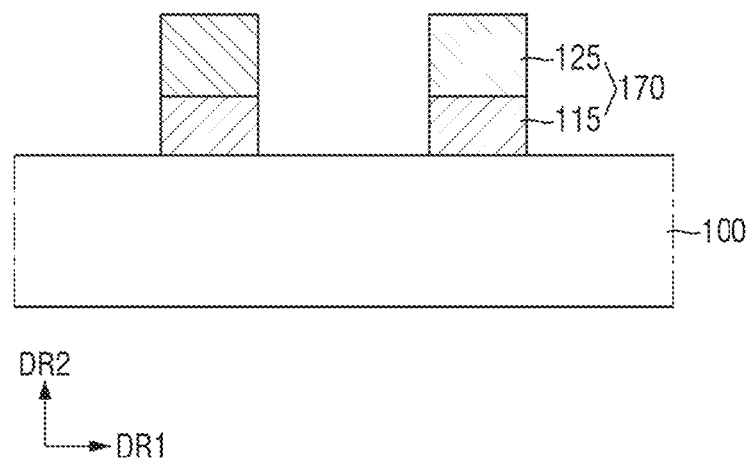

Referring to FIGS. 10, 13 and 14, the under layer 140, the second mask layer 120 and the first mask layer 110 may be sequentially etched to form a mask pattern 170 (S240).

Specifically, referring to FIG. 13, the under layer (140 of FIG. 12) may be etched using the second photoresist pattern 360 as a mask (e.g., a first mask) to form the under pattern 145. A part of the second photoresist pattern 360 may be etched, while the under pattern 145 is being formed.

Subsequently, the second mask layer (120 of FIG. 12) may be etched using the second photoresist pattern 360 and the under pattern 145 as masks (e.g., as a second mask) to form the second mask pattern 125. Restated, the second mask pattern 125 may be formed based on etching the second mask layer 120, and the mask pattern 170 may include the second mask pattern 125. A part of the second photoresist pattern 360 may be additionally etched, while the second mask pattern 125 is being formed.

Referring to FIG. 14, the first mask layer 110 may be etched using at least a part of the second photoresist pattern 360, the under pattern 145 and the second mask pattern 125 as masks (e.g., a third mask) to form the first mask pattern 115.

For example, the second photoresist pattern 360 and the under pattern 145 may be etched, while the first mask pattern 115 is being formed. Also, a part of the second mask pattern 125 may be etched, while the first mask pattern 115 is being formed.

Figure 15:
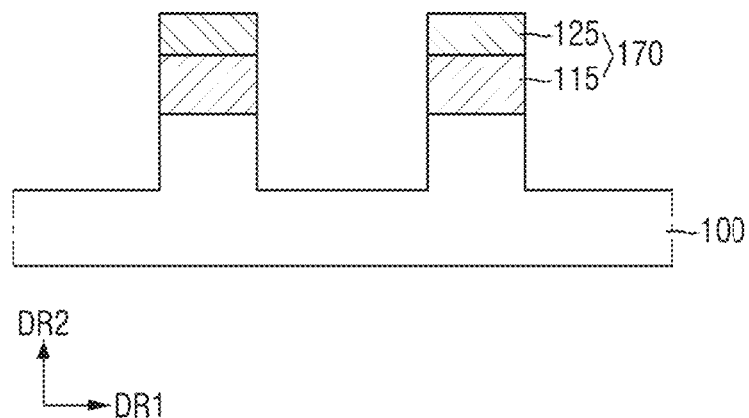

Referring to FIGS. 10 and 15, at least a part of the substrate 100 may be etched, using the mask pattern 170 including the second mask pattern 125 and the first mask pattern 115 as masks (S250). However, the present inventive concepts are not limited thereto. In some example embodiments, the mask pattern 170 may include the first mask pattern 115. A fine pattern may be formed on the substrate 100 through such a patterning process.

Hereinafter, a method for fabricating a semiconductor device according to some example embodiments of the present inventive concepts will be described referring to FIGS. 11, 16 and 17. Differences from the method for fabricating a semiconductor device shown in FIGS. 10 to 15 will be mainly described.

Figure 16:
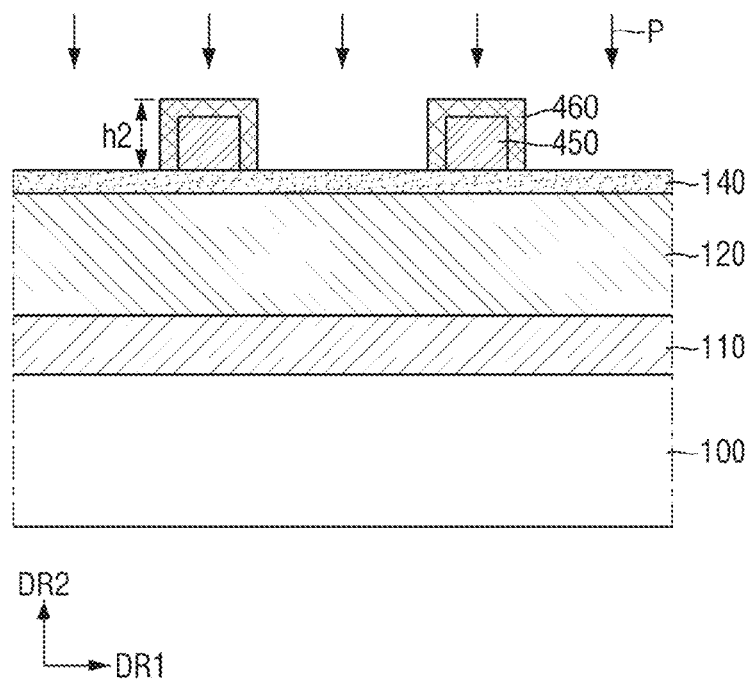
FIGS. 16 and 17 are intermediate stage diagrams for explaining a method for fabricating a semiconductor device according to some example embodiments of the present inventive concepts.
Figure 17:
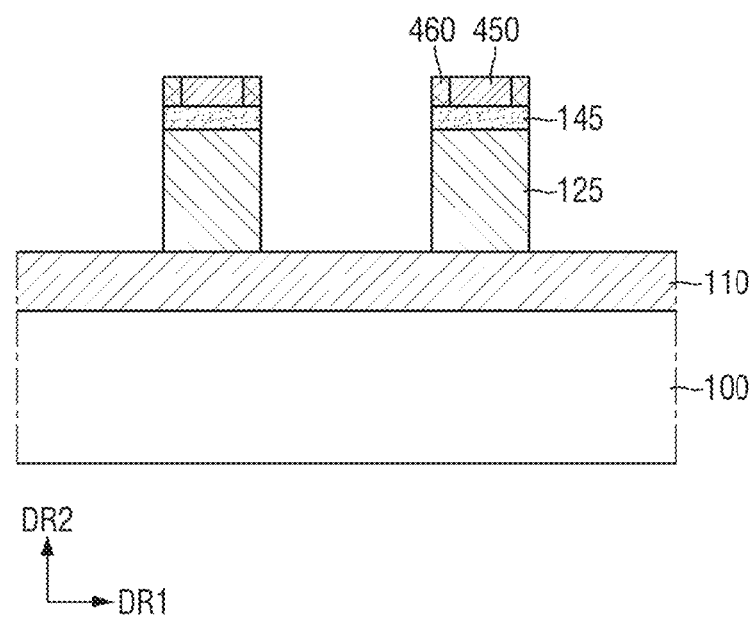

FIGS. 16 and 17 are intermediate stage diagrams for explaining a method for fabricating a semiconductor device according to some example embodiments of the present inventive concepts.

Referring to FIG. 11, the first mask layer 110, the second mask layer 120, the under layer 140, and the first photoresist pattern 350 may be sequentially stacked on the substrate 100.

Referring to FIG. 16, the plasma treatment process P using a gas including fluorine (F) element may be performed on the first photoresist pattern (350 of FIG. 11).

The surface of the first photoresist pattern (350 of FIG. may be converted into a second photoresist pattern 460 including tin fluoride ($SnF_x$) through the plasma treatment process P using fluorine (F) element.

For example, the upper surface and side walls of the first photoresist pattern (350 of FIG. 11) including tin (Sn) may be converted into the second photoresist pattern 460 including tin fluoride ($SnF_x$) through the plasma treatment process P using fluorine (F) element. A remaining portion 450 of the first photoresist pattern that has not been converted, and is not converted, into the second photoresist pattern 460 may be surrounded by the second photoresist pattern 460.

After the second photoresist pattern 460 is formed, no additional layer is formed on the second photoresist pattern 460. For example, after the second photoresist pattern 460 is formed, no additional layer being in contact with each of the upper surface and side walls of the second photoresist pattern 460 is formed.

The height h2 of the second photoresist pattern 460 in the vertical direction DR2 may be the same as the height h1 of the first photoresist pattern (350 of FIG. 11) in the vertical direction DR2. That is, the height h2 in the vertical direction DR2 from the upper surface of the under layer 140 to the upper surface of the second photoresist pattern 460 may be the same as the height h1 of the first photoresist pattern (350 of FIG. 11) in the vertical direction DR2.

Referring to FIG. 17, the under layer (140 of FIG. 16) may be etched using the remaining portion 450 of the first photoresist pattern and the second photoresist pattern 460 as masks to form the under pattern 145. A part of the second photoresist pattern 460 and a part of the remaining portion 450 of the first photoresist pattern may be etched, while the under pattern 145 is being formed.

Subsequently, the second mask layer (120 of FIG. 16) may be etched using the remaining portion 450 of the first photoresist pattern, the second photoresist pattern 460 and the under pattern 145 as masks to form a second mask pattern 125. While the second mask pattern 125 is being formed, a part of the remaining portion 450 of the first photoresist pattern and a part of the second photoresist pattern 460 may be additionally etched. Subsequently, the fabricating process shown in FIGS. 14 and 15 may be performed to form a fine pattern on the substrate 100.

Hereinafter, a method for fabricating a semiconductor device according to some example embodiments of the present inventive concepts will be described referring to FIGS. 18 to 22. Differences from the method for fabricating a semiconductor device shown in FIGS. 1 to 7 will be mainly described.

Figure 18:
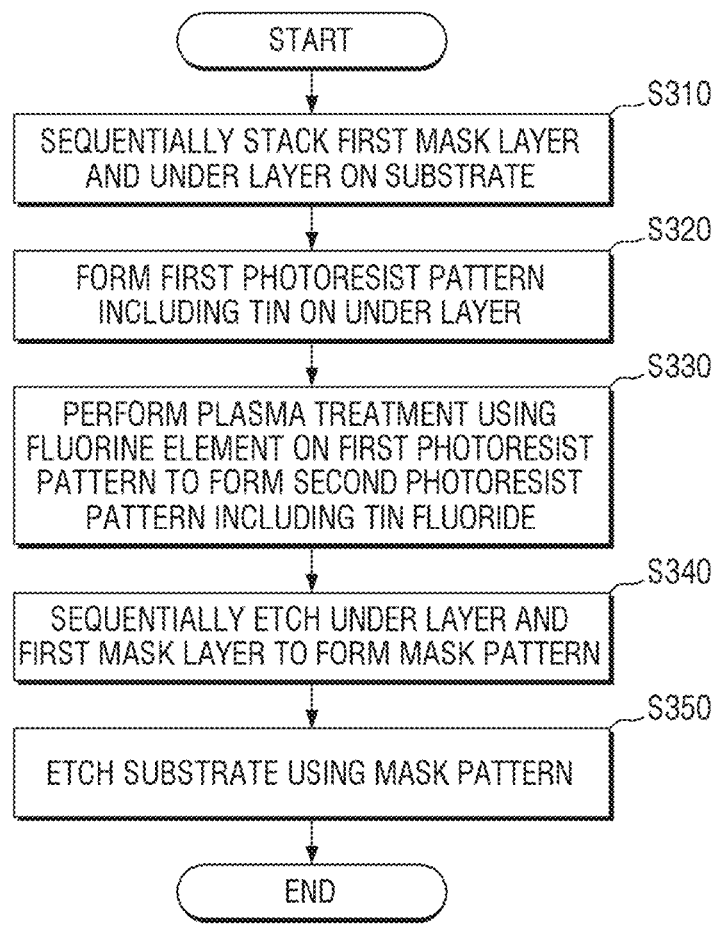
FIG. 18 is a flowchart for explaining a method for fabricating a semiconductor device according to some example embodiments of the present inventive concepts.

FIG. 18 is a flowchart for explaining a method for fabricating a semiconductor device according to some example embodiments of the present inventive concepts. FIGS. 19, 20, 21, and 22 are intermediate stage diagrams for explaining a method for fabricating a semiconductor device according to some example embodiments of the present inventive concepts.

Figure 19:
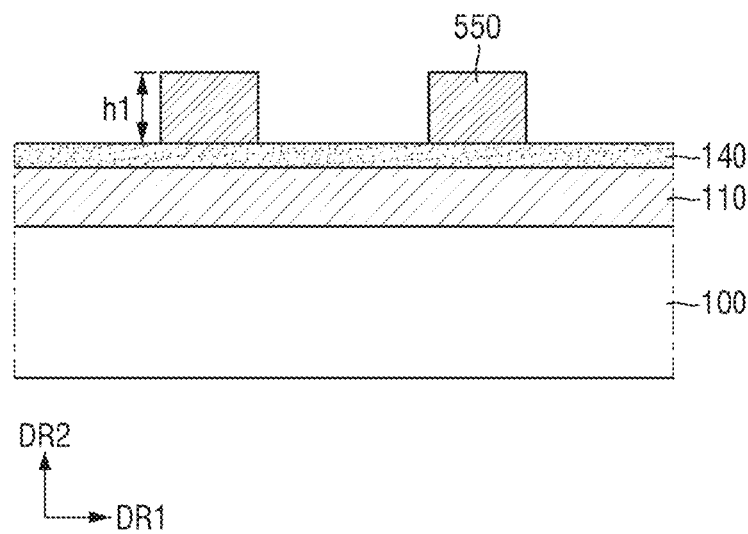
FIGS. 19, 20, 21, and 22 are intermediate stage diagrams for explaining a method for fabricating a semiconductor device according to some example embodiments of the present inventive concepts.

Referring to FIGS. 18 and 19, the first mask layer 110 and the wider layer 140 may be sequentially stacked on the substrate 100 (S310), such that the first mask layer 110 is formed on the substrate 100 and the under layer 140 is formed on the first mask layer 110. As shown in at least FIG. 11, forming the under laser 140 on the first mask layer 110 may include forming a second mask layer 120 on the first mask layer 110, and forming the under layer 140 on the second mask layer 120. As shown in at least FIG. 3, forming the under layer 140 on the first mask layer 110 may include forming a second mask layer 120 on the first mask layer 110, forming a third mask layer 130 on the second mask layer 120, and forming the under layer 140 on the third mask layer 130.

Subsequently, a first photoresist pattern 550 may be formed on the under layer 140 (S320). The first photoresist pattern 550 may be formed on the under layer 140 through a lithography process using extreme ultraviolet, also referred to as extreme ultraviolet light (EUV), for example using light having a 2% full width at half maximum (FWHM) bandwidth about 13.5 nm. The first photoresist pattern 550 may include, for example, tin (Sn).

Figure 20:
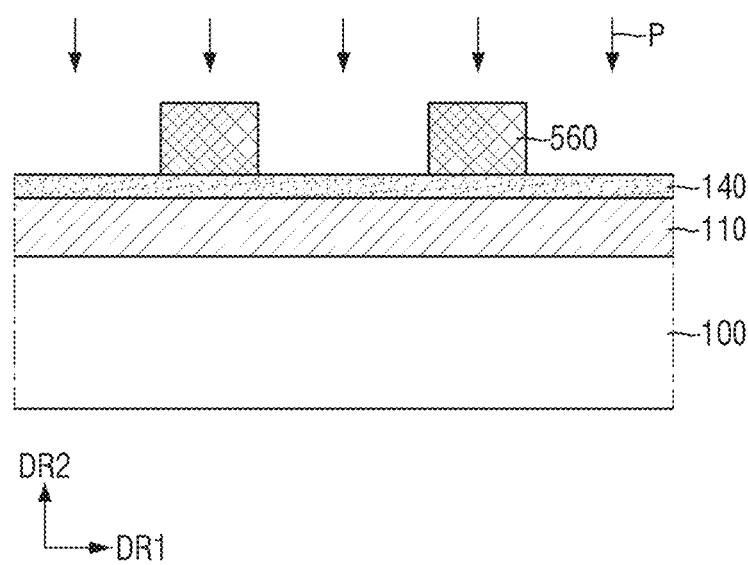

Referring to FIGS. 18 and 20, the plasma treatment process P which uses the gas including fluorine (F) element may be performed on the first photoresist pattern (550 of FIG. 19).

Through the plasma treatment process P using fluorine (F) element, the first photoresist pattern (550 of FIG. 19) including tin (Sn) may be at least partially or entirely converted into a second photoresist pattern 560 including tin fluoride ($SnF_x$) (S330). The concentration of tin fluoride ($SnF_x$) included in the second photoresist pattern 560 may be higher on the surface than on the inside.

After the second photoresist pattern 560 is formed, no additional layer is formed on the second photoresist pattern 560. For example, after the second photoresist pattern 560 is formed, no additional layer being in contact with each of the upper surface and side walls of the second photoresist pattern 560 is formed.

Figure 21:
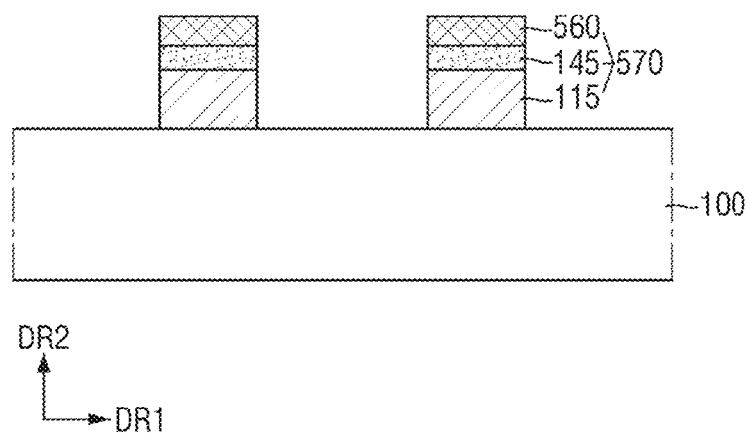

Referring to FIGS. 18 and 21, a mask pattern 570 may be formed by e.g., based on) sequentially etching the under layer 140 and the first mask layer 110 (S340).

Specifically, referring to FIG. 21, the under layer (140 of FIG. 20) may be etched using the second photoresist pattern 560 as a mask (e.g., a first mask) to form the under pattern 145. A part of the second photoresist pattern 560 may be etched while the under pattern 145 is being formed.

Subsequently, the first mask layer (110 of FIG. 20) may be etched using the second photoresist pattern 560 and the under pattern 145 as masks to form the first mask pattern 115. A part of the second photoresist pattern 560 may be additionally etched, while the first mask pattern 115 is being formed.

Through an etching process which uses the second photoresist pattern 560 as a mask (e.g., a first mask), a mask pattern 570 including at least a part of the second photoresist pattern 560, the under pattern 145 and the first mask pattern 115 may be formed on the substrate 100. However, the present inventive concepts are not limited thereto. In some example embodiments, the mask pattern 570 may include only the under pattern 145 and the first mask pattern 115, Also, in some example embodiments, the mask pattern 570 may include only the first mask pattern 115.

Figure 22:
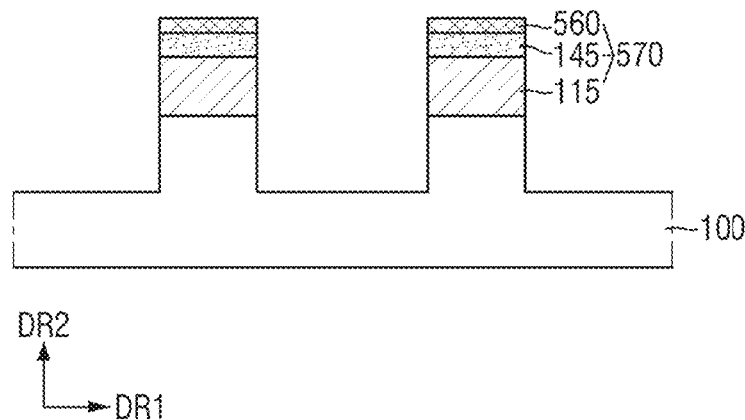

Referring to FIGS. 18 and 22, at least a part of the substrate 100 may be etched, using the mask pattern 570 including the second photoresist pattern 560, the under pattern 145 and the first mask pattern 115 as masks (e.g., as a second mask) (S350). A fine pattern may be formed on the substrate 100 through such a patterning process.

Hereinafter, a method for fabricating a semiconductor device according to some example embodiments of the present inventive concepts will be described referring to FIGS. 19, 23 to 25. Differences from the method for fabricating a semiconductor device shown in FIGS. 18 to 22 will be mainly described.

Referring to FIG. 19, the first mask layer 110, the under layer 140, and the first photoresist pattern 550 may be sequentially stacked on the substrate 100.

Figure 23:
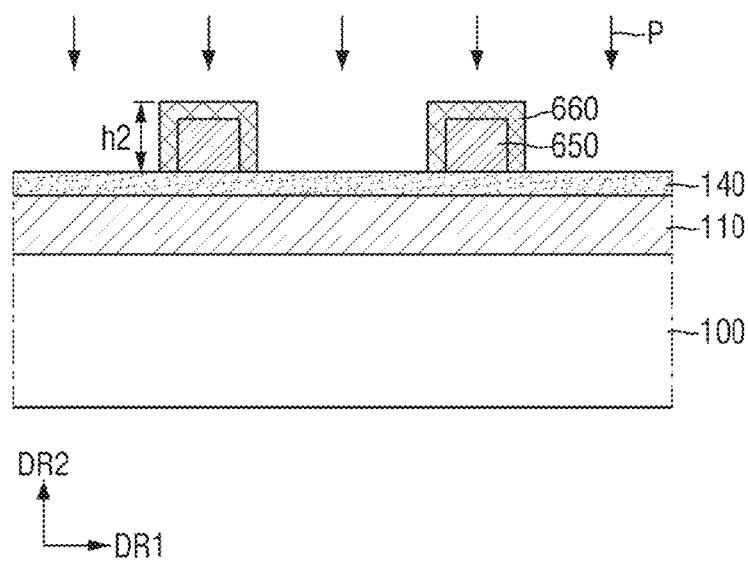
FIGS. 23, 24, and 25 are intermediate stage diagrams for explaining a method for fabricating a semiconductor device according to some example embodiments of the present inventive concepts.

Referring to FIG. 23, the plasma treatment process P using a gas including fluorine (F) element may be performed on the first photoresist pattern (550 of FIG. 19).

The surface of the first photoresist pattern (550 of FIG. 19) may be converted into a second photoresist pattern 660 including tin fluoride ($SnF_x$) through the plasma treatment process P using fluorine (F) element.

For example, the upper surface and side walls of the first photoresist pattern (550 of FIG. 19) including tin (Sn) may be converted into the second photoresist pattern 660 including tin fluoride ($SnF_x$) through the plasma treatment process P using fluorine (F) element. A remaining portion 650 of the first photoresist pattern that has not been converted, and is not converted, into the second photoresist pattern 660 may be surrounded by the second photoresist pattern 660.

After the second photoresist pattern 660 is formed, no additional layer is formed on the second photoresist pattern 660. For example, after the second photoresist pattern 660 is formed, no additional layer being in contact with each of the upper surface and side walls of the second photoresist pattern 660 is formed.

A height h2 of the second photoresist pattern 660 in the vertical direction DR2 may be the same as a height h1 of the first photoresist pattern (550 of FIG. 19) in the vertical direction DR2. That is, the height h2 in the vertical direction DR2 from the upper surface of the under layer 140 to the upper surface of the second photoresist pattern 660 may be the same as the height h1 of the first photoresist pattern (550 of FIG. 19) in the vertical direction DR2.

Figure 24:
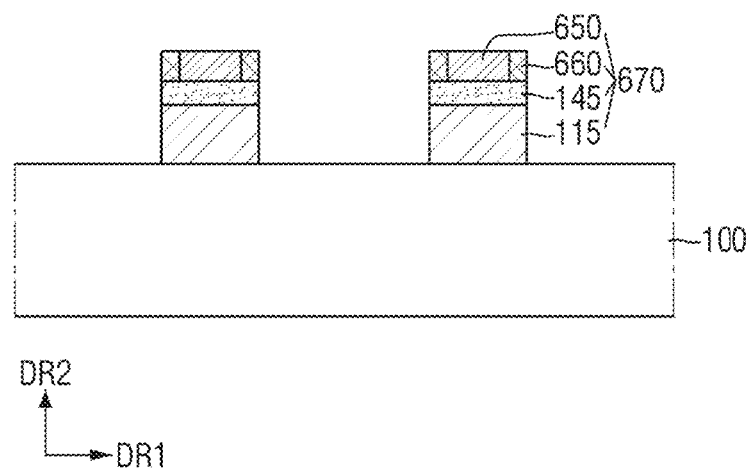

Referring to FIG. 24, the under layer (140 of FIG. 23) may be etched using the remaining portion 650 of the first photoresist pattern and the second photoresist pattern 660 as masks to form the under pattern 145. A part of the second photoresist pattern 660 and a part of the remaining portion 650 of the first photoresist pattern may be etched, while the under pattern 145 is being formed.

Subsequently, the first mask layer (110 of FIG. 23) may be etched using the remaining portion 650 of the first photoresist pattern, the second photoresist pattern 660 and the under pattern 145 as masks to form the first mask pattern 115. While the first mask pattern 115 is being formed, a part of the remaining portion 650 of the first photoresist pattern and a part of the second photoresist pattern 660 may be additionally etched.

A mask pattern 670 which includes a part of the remaining portion 650 of the first photoresist pattern, a part of the second photoresist pattern 660, the under pattern 145 and the first mask pattern 115 may be formed on the substrate 100, through the etching process which uses the remaining portion 650 of the first photoresist pattern and the second photoresist pattern 660 as masks. However, the present inventive concepts are not limited thereto. In some example embodiments, the mask pattern 670 may include only the under pattern 145 and the first mask pattern 115. Also, in some example embodiments, the mask pattern 670 may include only the first mask pattern 115.

Figure 25:
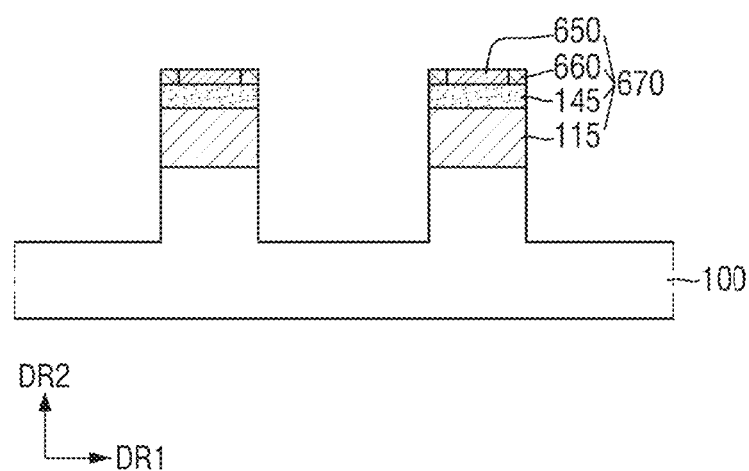

Referring to FIG. 25, at least a part of the substrate 100 may be etched, using the mask pattern 670 including the remaining portion 650 of the first photoresist pattern, the second photoresist pattern 660, the under pattern 145, and the first mask pattern 115 as a mask. A fine pattern may be formed on the substrate 100 through such a patterning process.

In concluding the detailed description, those skilled in the art will appreciate that many variations and modifications may be made to some example embodiments without substantially departing from the principles of the present inventive concepts. Therefore, some example embodiments of the inventive concepts are used in a generic and descriptive sense only and not for purposes of limitation.

What is claimed is:

1. A method for fabricating a semiconductor device, the method comprising:
   forming a first mask layer on a substrate;
   forming an under layer on the first mask layer;
   forming a first photoresist pattern on the under layer, the first photoresist pattern including tin;
   converting at least a part of the first photoresist pattern into a second photoresist pattern including tin fluoride, through a plasma treatment process using fluorine element;
   etching the under layer using the second photoresist pattern as a first mask to form an under pattern;
   etching the first mask layer to form a first mask pattern; and
   etching at least a part of the substrate, using a mask pattern including the first mask pattern as a second mask.

2. The method for fabricating the semiconductor device of claim 1, wherein formation of the under layer on the first mask layer further comprises:
   forming a second mask layer on the first mask layer, and
   forming the under layer on the second mask layer.

3. The method for fabricating the semiconductor device of claim 2, wherein formation of the under layer on the first mask layer further comprises:
   forming a third mask layer on the second mask layer.

4. The method for fabricating the semiconductor device of claim 2, wherein the mask pattern further comprises a second mask pattern formed based on etching the second mask layer.

5. The method for fabricating the semiconductor device of claim 1, wherein the mask pattern further comprises the under pattern.

6. The method for fabricating the semiconductor device of claim 5, wherein the mask pattern further comprises at least a part of the second photoresist pattern.

7. The method for fabricating the semiconductor device of claim 1, wherein formation of the second photoresist pattern comprises entirely converting the first photoresist pattern into the second photoresist pattern.

8. The method for fabricating the semiconductor device of claim 1, wherein formation of the second photoresist pattern comprises
   converting an upper surface and side walls of the first photoresist pattern into the second photoresist pattern, and surrounding a remaining portion of the first photoresist pattern, which is not converted, by the second photoresist pattern.

9. The method for fabricating the semiconductor device of claim 1, wherein a height of the first photoresist pattern in a vertical direction is 10 nm to 50 nm.

10. The method for fabricating the semiconductor device of claim 1, wherein the first photoresist pattern is formed through a lithography process which uses extreme ultraviolet light.

11. The method for fabricating the semiconductor device of claim 1, wherein after the second photoresist pattern is formed, no additional layer being in contact with each of an upper surface and side walls of the second photoresist pattern is formed.

12. A method for fabricating a semiconductor device, the method comprising:
   forming a first mask layer on a substrate;
   forming a second mask layer on the first mask layer;
   forming an under layer on the second mask layer;
   forming a first photoresist pattern on the under layer, the first photoresist pattern including tin;
   converting at least a part of the first photoresist pattern into a second photoresist pattern including tin fluoride, through a plasma treatment process using fluorine element;
   etching the under layer using the second photoresist pattern as a first mask to form an under pattern;
   etching the second mask layer using the under pattern as a second mask to form a second mask pattern;
   etching the first mask layer using the second mask pattern as a third mask to form a first mask pattern; and
   etching at least a part of the substrate, using a mask pattern including the first mask pattern and the second mask pattern.

13. The method for fabricating the semiconductor device of claim 12, wherein formation of the under layer on the second mask layer further comprises
   forming a third mask layer on the second mask layer.

14. The method for fabricating the semiconductor device of claim 13, wherein formation of the second mask pattern comprises etching the third mask layer using the second photoresist pattern and the under pattern as masks to form a third mask pattern; and etching the second mask layer, using at least a part of the second photoresist pattern, the wider pattern, and the third mask pattern as masks.

15. The method for fabricating the semiconductor device of claim 14, wherein formation of the first mask pattern comprises etching the first mask layer, using at least a part of the third mask pattern and the second mask pattern as masks.

16. The method for fabricating the semiconductor device of claim 12, wherein formation of the second photoresist pattern comprises entirely converting the first photoresist pattern into the second photoresist pattern.

17. The method for fabricating the semiconductor device of claim 12, wherein formation of the second photoresist pattern comprises converting an upper surface and side walls of the first photoresist pattern into the second photoresist pattern, and surrounding a remaining portion of the first photoresist pattern, which is not converted, by the second photoresist pattern.

18. The method for fabricating the semiconductor device of claim 12, wherein formation of the first mask pattern comprises etching the first mask layer, using at least a part of the second photoresist pattern, the under pattern and the second mask pattern as masks.

19. A method for fabricating a semiconductor device, the method comprising:

forming a first mask layer on a substrate;

forming an under layer on the first mask layer;

forming a first photoresist pattern on the under layer, through a lithography process using extreme ultraviolet light, the first photoresist pattern including tin;

entirely converting the first photoresist pattern into a second photoresist pattern including tin fluoride, through a plasma treatment process using fluorine element;

etching the under layer using the second photoresist pattern as a first mask to form an under pattern;

etching the first mask layer to from a first mask pattern; and etching at least a part of the substrate, using a mask pattern including the first mask pattern as a second mask, wherein after the second photoresist pattern is formed, no additional layer being in contact with each of an upper surface and side walls of the second photoresist pattern is formed.

20. The method for fabricating the semiconductor device of claim 19, wherein formation of the under layer on the first mask layer further comprises forming a second mask layer on the first mask layer, and forming the under layer on the second mask layer.

* * * * *